United States Patent
Karstens

(10) Patent No.: US 7,849,344 B2
(45) Date of Patent: Dec. 7, 2010

(54) METHOD FOR IMPROVING ACCURACY IN PROVIDING INFORMATION PERTAINING TO BATTERY POWER CAPACITY

(75) Inventor: Christopher Kent Karstens, Apex, NC (US)

(73) Assignee: International Business Machines Corporation, Armonk, NY (US)

(*) Notice: Subject to any disclaimer, the term of this patent is extended or adjusted under 35 U.S.C. 154(b) by 712 days.

(21) Appl. No.: 11/780,715

(22) Filed: Jul. 20, 2007

(65) Prior Publication Data

US 2009/0024863 A1 Jan. 22, 2009

(51) Int. Cl.
G06F 1/00 (2006.01)
H02J 7/00 (2006.01)
G08B 21/00 (2006.01)
G01R 31/36 (2006.01)

(52) U.S. Cl. .................. 713/340; 713/300; 320/127; 320/137; 340/636.1; 702/63

(58) Field of Classification Search .............. 713/300, 713/340; 320/127, 137; 340/636.1; 702/63
See application file for complete search history.

(56) References Cited

U.S. PATENT DOCUMENTS

| | | | |
|---|---|---|---|
| 4,743,831 A * | 5/1988 | Young | 320/127 |
| 5,600,230 A | 2/1997 | Dunstan | |
| 6,211,654 B1 | 4/2001 | O'Sullivan | |
| 6,529,840 B1 * | 3/2003 | Hing | 702/63 |
| 6,618,681 B2 | 9/2003 | Hoenig et al. | |
| 6,892,148 B2 | 5/2005 | Barsoukov et al. | |
| 7,528,576 B2 * | 5/2009 | Ukon | 320/132 |
| 7,541,775 B2 * | 6/2009 | Lee | 320/132 |

OTHER PUBLICATIONS

Balliet et al., "Dynamic Rechargeable Battery end-of-Life Prediction", IBM Technical Disclosure Bulletin, vol. 29, No. 1, Jun. 1986, pp. 352-356.

* cited by examiner

*Primary Examiner*—Mark Connolly
*Assistant Examiner*—Stefan Stoynov
(74) *Attorney, Agent, or Firm*—Yee & Associates, P.C.; Steven L. Bennett

(57) ABSTRACT

A method is disclosed for providing information related to the power capacity of a rechargeable battery at a specified time, wherein the battery is disposed to supply power to a laptop computer or other electronic device. The method comprises the step of acquiring a set of cumulative data that represents the capacity of the battery at different times when the battery is being used to supply power to the device. The method further comprises selectively processing the set of data, to provide an estimate of the battery time that is available at the specified time. The estimate is then used to determine whether or not the battery has sufficient power capacity to complete a particular task subsequent to the specified time.

17 Claims, 4 Drawing Sheets

| | 1 | 2 | 3 | 4 | 5 | 6 | 7 | 8 | 9 | 10 | 11 | 12 | 13 | 14 | 15 | 16 | 17 | 18 | 19 | 20 | |
|---|---|---|---|---|---|---|---|---|---|---|---|---|---|---|---|---|---|---|---|---|---|
| (A) 100% → 99%: | 10 | 10 | 9 | 10 | 11 | 10 | 9 | 10 | 9 | 9 | 9 | 9 | 9 | 8 | 9 | 8 | 8 | 8 | 8 | 8 | (MINUTES) |
| (B) 99% → 98%: | 10 | 10 | 9 | 10 | 10 | 11 | 12 | 10 | 10 | 9 | 9 | 9 | 9 | 8 | 9 | 8 | 8 | 9 | 8 | 9 | (MINUTES) |

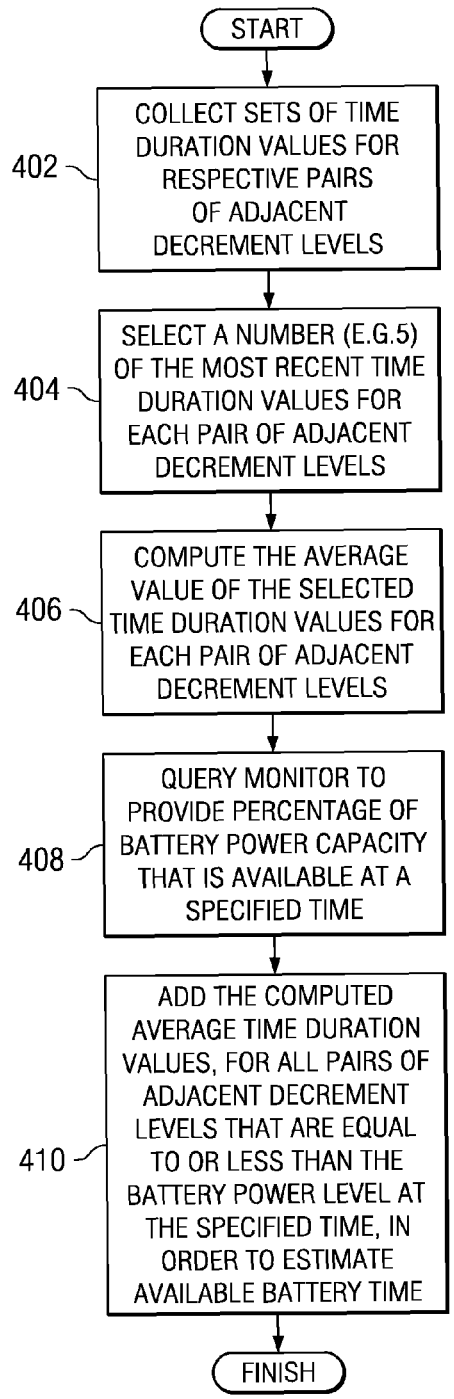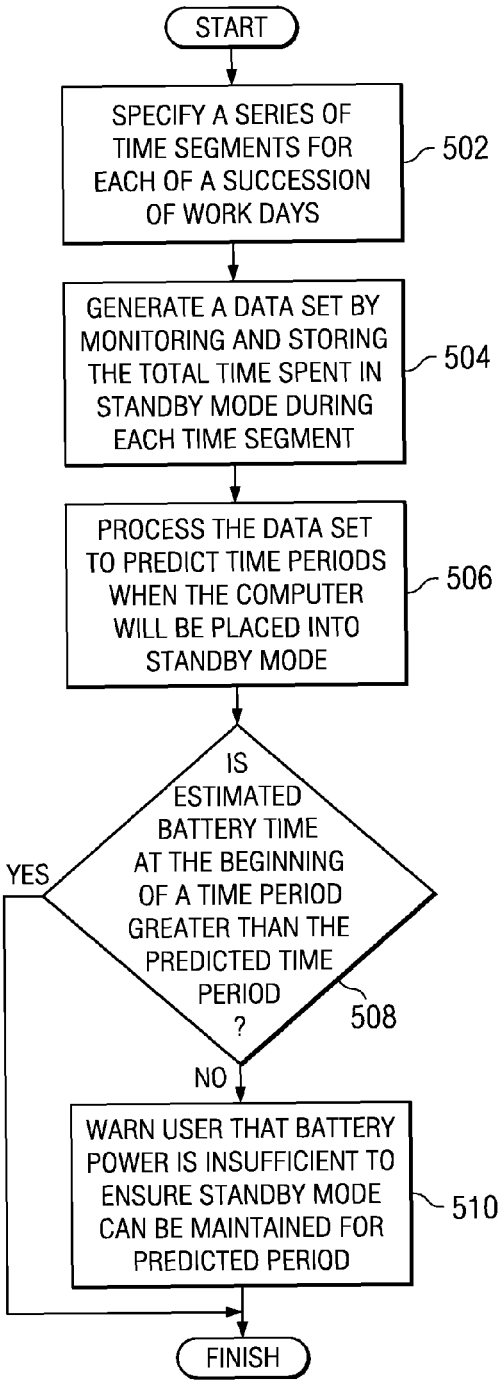
FIG. 4
FIG. 5

METHOD FOR IMPROVING ACCURACY IN PROVIDING INFORMATION PERTAINING TO BATTERY POWER CAPACITY

BACKGROUND OF THE INVENTION

1. Field of the Invention

The invention disclosed herein generally pertains to a method and apparatus for providing information related to the power capacity of a rechargeable battery, wherein the battery is disposed to supply power to an electronic device. More particularly, the invention pertains to a method of the above type that improves accuracy in providing such information. Even more particularly, the invention pertains to a method of the above type wherein such information is based on actual monitored performance of the battery.

2. Description of the Related Art

As is well known, rechargeable batteries are used as a power source for ever-increasing numbers and types of electronic products. These products can include, without limitation, laptops, notebooks, and other highly portable computers, mobile phones and personal data assistants (PDA). Rechargeable batteries are also used widely as emergency power sources, for electronic devices normally connected to power lines. In computer and other electronic products, the available power capacity of a rechargeable battery, at any given time, is typically expressed as a percentage of maximum power capacity, wherein maximum capacity represents available battery power right after completing a recharge operation.

The term "battery time" as used by those of skill in the art, and also as such term is used herein, means the amount of time that a battery can be used as a power source for a particular purpose, or in a particular mode, until the battery power is completely dissipated. At present, the percentage of power capacity, as discussed above, is typically used as a basis for estimating the available battery time. In laptop computers or the like, it is common to indicate the battery time that can be expended for a particular percentage of capacity for each of three different modes of computer use, e.g., normal, maximum and minimum modes.

Currently used approaches for estimating battery time are usually based on the capability of batteries to store and provide power when they are new. However, the ability of a battery to store power tends to decline significantly, as the battery is used repeatedly over time. For example, the battery time, or operational expectancy, of a new battery charged to 100% power capacity could be three hours. After the battery has been used on a daily basis for three or four years, however, and has been continually discharged to supply power and then charged back to full capacity, battery time for 100% capacity could in fact be only one hour. Toward the end of its life, maximum battery time may even be as low as 5-10 minutes.

Generally, prior art procedures for furnishing battery time do not consider how a battery has been operated over time. Thus, no historical record is kept of battery usage. As a result, it is very common for a user of a device with a rechargeable battery to discover that the battery has run out of power, well before the anticipated battery time has ended. It will be readily appreciated that such events can be inconvenient, very undesirable or even catastrophic.

As an example, it is well known by users of laptop computers that placing a laptop into standby mode reduces the power required to a fraction of the power needed for a normal mode of operation. At the same time, the laptop can be started up almost instantaneously from standby mode, without a need for booting. Accordingly, it has become common for a laptop user to place the laptop computer into standby mode, when the computer contains work in process for an uncompleted task, and the user must suspend work for a period of time. This occurs frequently, for example, when a user reaches the end of a work day at, e.g. 5 PM, and will resume work the next day at, e.g. 8 AM. For this situation, if the user places his computer into standby mode at 5 PM, the computer battery would need to supply power to operate in this mode for 15 hours. Assuming that the read out on the laptop computer shows sufficient power capacity, e.g. 50%, to provide a battery time of over 15 hours in standby mode, the user would anticipate no difficulties. However, because of advanced battery age, the power would in fact be completely dissipated before the end of the 15 hour period. This would cause the computer to completely shut down, so that the work in process would be lost. Thus, the result of inaccurate battery time information could be quite serious.

BRIEF SUMMARY OF THE INVENTION

A method is disclosed for providing information related to the power capacity of a rechargeable battery at a specified time, wherein the battery is disposed to supply power to a laptop computer or other electronic device. The method comprises the step of acquiring a cumulative set of data that represents the capacity of the battery at different times, when the battery is being used to supply power to the device. The method further comprises selectively processing the set of data, to provide an estimate of the battery time that is available at the specified time. The estimate is then used to determine whether or not the battery has sufficient power capacity to complete a particular task subsequent to the specified time.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is a flow chart depicting principal steps for an embodiment of the invention.

FIG. 5 is a flow chart depicting principal steps for a further embodiment of the invention.

DETAILED DESCRIPTION OF THE INVENTION

Figure 1:
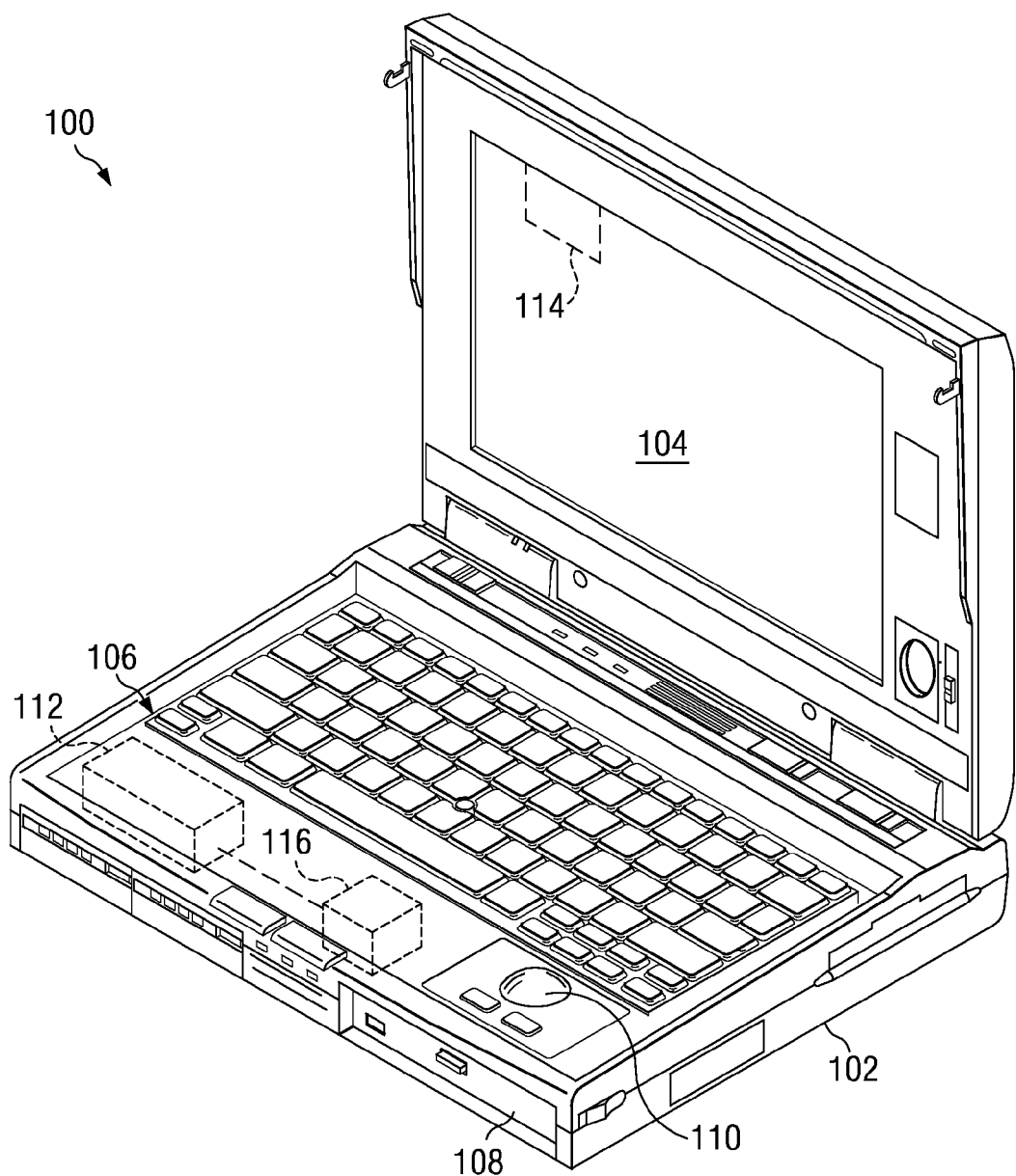
FIG. 1 is a pictorial representation of a laptop computer or other electronic device in which an embodiment of the invention is implemented.

Referring to FIG. 1, there is shown a pictorial representation of a laptop or other highly portable computer 100 in which an embodiment of the invention may be implemented. Computer 100 includes system unit 102, a video display screen 104, keyboard 106, storage devices 108, which may include floppy drives and other types of permanent and removable storage media, and a trackball or mouse 110. Additional input devices (not shown) may be included with computer 100, such as a joystick, touchpad, or microphone. Computer 100 also can include a graphical user interface (GUI) that may be implemented by means of system software residing in computer readable media operating in computer 100.

Referring further to FIG. 1, there is shown computer 100 provided with a rechargeable battery 112, which is disposed to supply all power needed for computer operations. Also, when a user wants to be informed of the available power capacity of battery 112, he directs the computer to display a readout 114 or the like, which indicates the then-current power capacity as a percentage, as described above. Readout 114 may also display an estimate of available battery time for operating computer 100 in a specified mode, wherein the estimate is computed as described herein.

FIG. 1 further shows a conventional monitor device 116 connected to battery 112 to continually track the capacity thereof. Monitor 116 may be a component of a battery controller (not shown) for computer 100, and can keep track of battery capacity by periodically measuring and processing voltage and current parameters of battery 112, in a conventional manner.

Figures 2, 3:
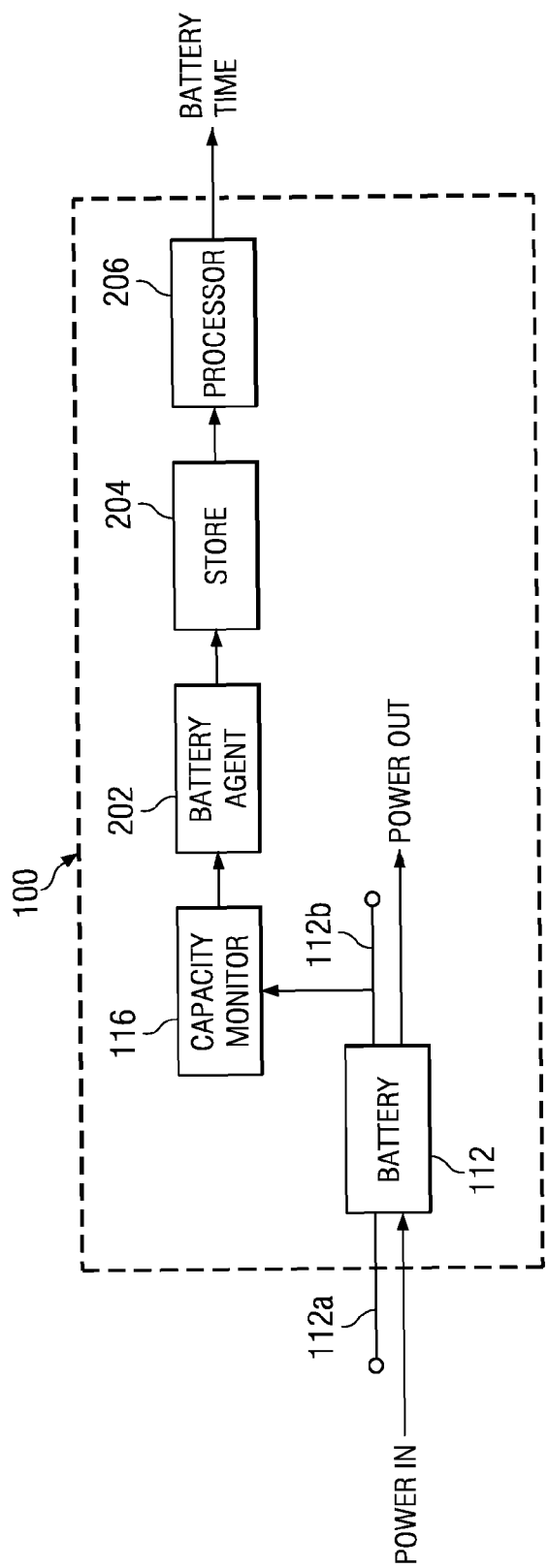
FIG. 2 is a schematic diagram showing components of the computer of FIG. 1 that are respectively configured to implement an embodiment of the invention.
FIG. 3 is a systematic representation of data acquired in implementing an embodiment of the invention.

Referring to FIG. 2, there is shown battery 112 provided with an input terminal 112a, which is connectable to a power source (not shown) whenever it becomes necessary to recharge battery 112. Battery 112 is also provided with an output terminal 112b, which carries power from battery 112 to respective components of computer 100 during operation thereof. FIG. 2 further shows monitor 116 connected to terminal 112b, in order to monitor power capacity as described above. At any given time, when power is being drawn from battery 112 through the terminal 112b, monitor 116 determines the power then available in the battery, as a percentage of total power capacity. As described hereinafter in further detail, monitor 116 also can provide the available power at a given time as the battery is being recharged, through input terminal 112a.

Referring further to FIG. 2, there is shown computer 100 provided with a battery agent 202, which usefully comprises a software tool but is not limited thereto. Battery agent 202 is connected to monitor 116, in order to receive successive battery capacity values as determined by the monitor. Agent 202 is also connected to a storage component 204 and a processor 206 of computer 100. Agent 202 cooperatively interacts with these components, to provide battery time estimates for battery 112 that are based on actual recent performance of the battery. In a useful embodiment of the invention, battery agent 202 achieves this objective in accordance with teachings of FIG. 3, and by carrying out respective steps as shown by FIG. 4.

When battery 112 has been charged to 100% or other percentage of its power capacity, and is then operated to supply power, battery agent 202 tracks the time in minutes for the capacity to decrease from the charged capacity level to a lower percentage level. As an example, after the battery 112 is charged to 100%, agent 202 tracks the time duration for capacity to decrease from the 100% level to a level of 99%. Battery agent 202 then tracks the time duration for battery capacity to decrease from the 99% level to a level of 98%. More generally, agent 202 detects the time duration value for decreasing from a percentage level to the next lower, or adjacent, percentage level, for each of a succession of levels. This process continues either until the power of battery 112 is completely dissipated, or the battery is again being charged by a battery charger. Also, each detected time duration value is placed into storage component 204.

Each percentage level of the type described above is referred to herein as a "decrement level". Moreover, the above time detection process is carried out each time the battery is discharged, after being charged back up to 100% capacity, or to other percentage of power capacity. Thus, for a given pair of adjacent percentage levels, or decrement levels, time duration value is collected and stored, each time battery capacity decreases between those two levels. After a succession of battery discharges, a set of time duration values are collected and stored for the given pair of adjacent levels.

While the above example referred to decrement levels at regular intervals such as 1%, it is to be understood that the adjacent levels, as reported by the monitor, may change over time. As the battery ages, the monitored percentage may go from 100% directly to 72%, then directly to 71%, and then directly to 45%. However, even though the monitor does not report capacity percentages at sequential, equally spaced intervals, such as at each 1% interval, the time duration can still be computed for each such interval. For example, if the monitor detected 100% capacity, and then detected 72% capacity after a time duration of two minutes, battery agent 202 would determine that 100%−72%=28%, and that 28% divided by two minutes is a 14% decrease per minute. Thus every 4.29 seconds the battery power capacity decreased by 1%. The storage time table can therefore be updated for each sequential percent level, e.g. 100%→99%→98% . . . 73%, with 4.29 seconds.

Referring to FIG. 3, there are shown two sets of time duration data. More particularly, row (A) of FIG. 3 shows time duration values 1-20. These values were respectively acquired during the twenty most recent instances that the battery dissipated from a decrement level of 100% to the adjacent decrement level of 99%. Row (B) likewise shows time duration values 1-20, acquired for the twenty most recent instances of the battery dissipating from a decrement level of 99% to the adjacent decrement level of 98%. For each such pair of adjacent decrement levels, the most recent collected time durations are the durations 16-20.

Referring to the flow chart of FIG. 4, the above process of collecting sets of time duration values for respective pairs of adjacent decrement levels is shown as step 402. At step 404, a pre-specified number of the most recently collected time durations is selected for each pair of adjacent decrement levels. Usefully, the pre-specified number is five time durations, but the invention is not limited thereto. For the data sets of FIG. 3, the five most recent time duration values would be the values 16-20.

At step 406 of FIG. 4, the average value of the selected (e.g. five) most recent time durations is computed for each pair of adjacent decrement levels. For time duration set (A) of FIG. 3, it is seen from time duration values 1-5 that the battery had previously dissipated from 100% of capacity to 99% of capacity during a time of approximately ten minutes. More recently, as shown by the time duration values 16-20, battery dissipation has accelerated for the decrement pair of 100%-99%, and is now approximately eight minutes. It is thus seen that the most recent time duration values 16-20 are the most relevant for estimating the present or current operating characteristics of battery 112.

Referring further to FIG. 4, step 408 indicates that monitor 116 is to be queried in order to provide the percentage level of battery power capacity that is available at a specified time. Typically, this will be the present time or the time that the query is made, but the invention is not limited thereto. The available percentage level is then used at step 410, to provide an estimate of available battery time. This is accomplished by adding the computed average time duration values for all pairs of adjacent decrement levels that are equal to or less than the percentage level at the specified time. Thus, if the percentage level of available power capacity was stated to be 30% at the specified time, the average time duration for dissipating from the 30% level to a level of 29% would be added to the average for dissipating from the 29% level to 28%, and so forth down to the average time duration value for dissipating from a level of 1% to 0%. The final sum, resulting collectively from these additions, would then be the estimated available battery time, for battery power capacity at a level of 30%.

It will be understood that while the above embodiment discloses decrement levels that are separated from one another by values of 1%, in other embodiments different values could be used for spacing the decrement values. For example, decrement levels could be separated by a value of 5%, or alternatively by one half of one percent.

In yet another embodiment of the invention, similar methodology could be used to estimate the time needed to recharge the battery up to 100%, or to some other prespecified capacity level, from a particular lower capacity level. To achieve this, battery agent 202 would be connected to track the time duration for battery capacity to increase, from one percentage level or "increment level", to the next adjacent level. This would be done for each of a succession of increment levels, and sets of time duration values would be collected for respective pairs of adjacent increment levels. An average time duration value would be computed for each pair of adjacent increment levels, from a number of the most recent values thereof. Respective average values would then be selectively added, to estimate the time required to fully recharge the battery, starting from the particular capacity percentage level. The battery agent 202 could also provide the time required to recharge the battery up to a number of levels less than 100%. For example, if the particular current capacity level was 14%, agent 202 could provide the following recharge times to reach 70%, 80%, 90% and 100% capacity levels, respectively:

Current percentage charged=14%
14%–>70%=0.6 hour
14%–>80%=1.3 hour
14%–>90%=1.9 hour
14%–>100%=2.8 hour To further enhance the accuracy of battery time estimate, the procedure of FIG. 4 can be used to collect time duration data for battery operation at each of a number of different power usage levels. For example, a laptop may be using power at a maximum level, when the processor thereof is directed to operate in its fastest mode or run time, such as 3 GHz. Power use would be minimum when the laptop was being operated in its slowest run time mode, such as 800 MHz. Battery agent 202 could be configured to recognize both maximum and minimum modes of power use. The agent 202 could also be configured to recognize operation at a normal or median level of power use, computed by the agent to be somewhere between the maximum and minimum power use modes. Moreover, agent 202 could be configured to recognize standby mode of computer operation, wherein power use is substantially reduced from the active modes.

It is to be understood that battery time is closely related to the level or rate at which power is being used. More specifically, battery time will be shorter for maximum power mode than for minimum or standby modes. Accordingly, to significantly improve accuracy in estimating battery time, it is useful to collect multiple sets of data, as described above in connection with FIG. 4, wherein one set of data is collected for each mode of power use. Upon recognizing that the laptop is operating in a particular mode, battery agent 202 would collect and store time duration values for adjacent decrement pairs in that mode. This data would then be used subsequently, to estimate battery time for operation in that mode.

Referring to FIG. 5, there is shown a flow chart illustrating a further embodiment of the invention. As shown by step 502, a series of time slots or segments are specified for each of a succession of work days, in connection with the laptop computer 100. For example, one hour time segments could be established from 12 PM to 6 PM, when the work day ends and the computer is turned off. At step 504, battery agent 202 is configured to monitor and store the total time that computer 100 is in standby mode, during each time segment. This information is collected for each of the work days, to generate a set of data. As an example, the following data shows the amount of time (in minutes) that computer 100 was in standby mode during each one hour segment, for the past seven days:

From 12 PM-1 PM (oldest to newest): 1,5,3,3,0,0,1
From 1 PM-2 PM (oldest to newest): 10,60,0,0,0,0,0
From 2 PM-3 PM (oldest to newest): 4,0,3,3,7,2,5
From 3 PM-4 PM (oldest to newest): 60,60,60,60,60,60,60
From 4 PM-5 PM (oldest to newest): 60,60,60,60,60,60,60
From 5 PM-6 PM (oldest to newest): 60,60,60,60,60,60,60

Referring further to FIG. 5, at step 506 agent 202 is operated to selectively process the data set, in order to predict one or more time periods when the computer will be placed into standby mode. From the above data, agent 202 can conclude that the computer will be placed into standby mode at or just before 3 PM on each work day, and will remain in standby mode until 6 PM, when the computer is turned off. During this period, it is likely that the computer user will not closely monitor battery time. Accordingly, at the beginning of the predicted time, battery agent 202 estimates the battery time then available for operation in standby mode. This estimate can be made using the process described above, in connection with FIG. 4. As shown by step 508, it is then determined whether or not the estimated battery time is greater than the predicted time period. If it is, there is sufficient battery power to operate in standby mode until 6 PM, and the process of FIG. 5 is ended. However, if the query for step 508 produces a negative result, the user must be warned of a possible insufficiency of battery power, as indicated by step 510. This warning could, for example, be an audio alarm, a visual prompt that requires operator approval before standby mode will be enabled, or both.

Figure 6:
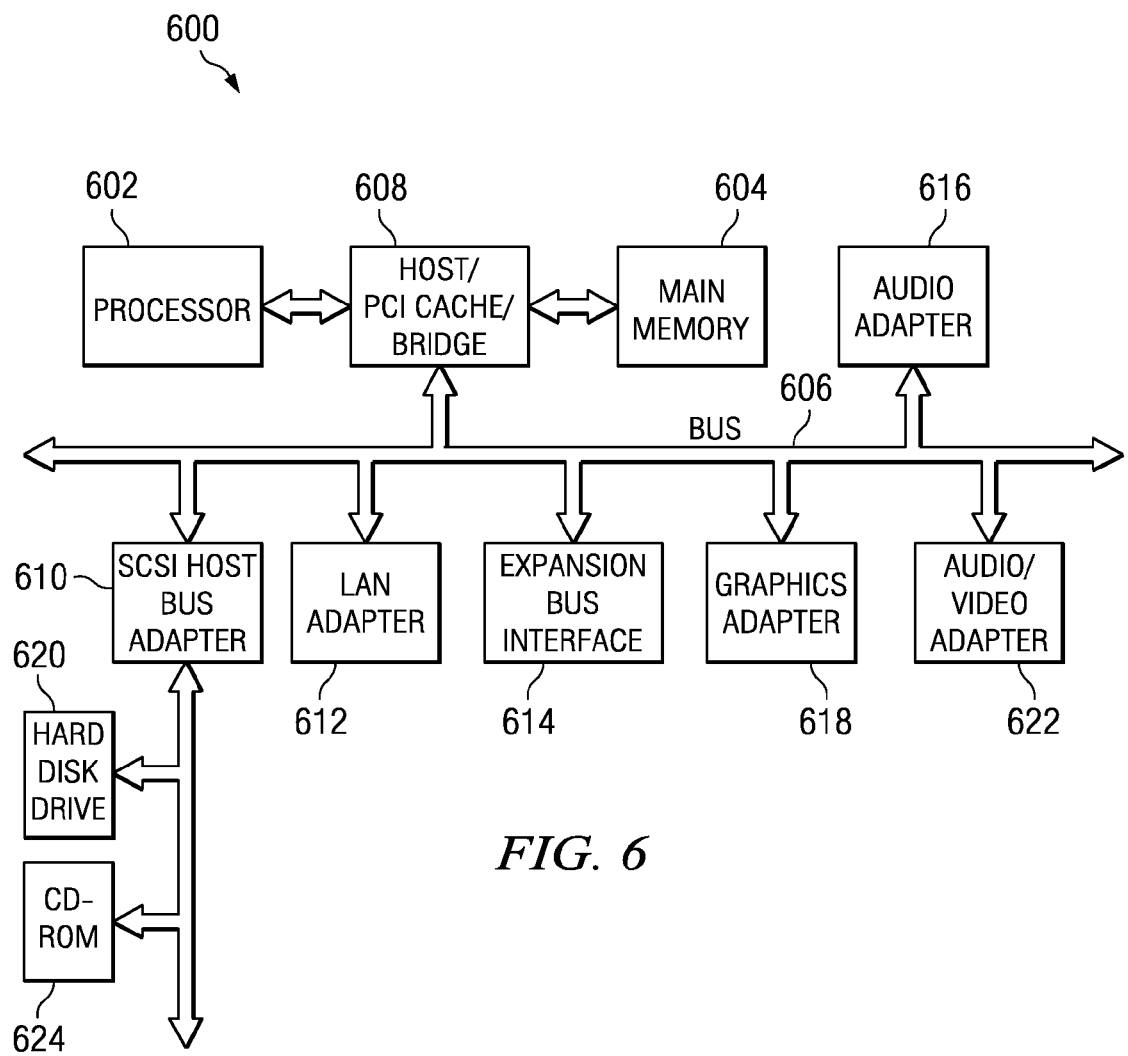
FIG. 6 is a diagram showing an exemplary configuration for the computer of FIG. 1.

Referring to FIG. 6, there is shown a block diagram of a generalized data processing system 600 which may be adapted to implement embodiments of the invention described herein. Data processing system 600 exemplifies a computer, such as laptop computer 100, in which code or instructions for implementing embodiments of the invention may be located. Data processing system 600 usefully employs a peripheral component interconnect (PCI) local bus architecture, although other bus architectures such as Accelerated Graphics Port (AGP) and Industry Standard Architecture (ISA) may alternatively be used. FIG. 6 shows processor 602 and main memory 604 connected to PCI local bus 606 through Host/PCI Cache bridge 608. PCI bridge 608 may also include an integrated memory controller and cache memory for processor 602. It is thus seen that data processing system 600 is provided with components that may readily be adapted to provide other components for implementing embodiments of the invention as described herein. Referring further to FIG. 6, there is shown local area network (LAN) adapter 612, small computer system interface (SCSI) host bus adapter 610, and expansion bus interface 614 respectively connected to PCI local bus 606 by direct component connection. Audio adapter 616, graphics adapter 618, and audio/video adapter 622 are connected to PCI local bus 606 by means of add-in boards inserted into expansion slots. SCSI host bus adapter 610 provides connection for hard disk drive 620, and also for CD-ROM drive 624.

The invention can take the form of an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Further, a computer storage medium may contain or store a computer readable program code such that when the computer readable program code is executed on a computer, the execution of this computer readable program code causes the computer to transmit another computer readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for providing information relating to the power capacity of a rechargeable battery at a specified time, wherein the battery is disposed to supply power to an electronic device, the method comprising the steps of:
   acquiring a set of cumulative data that represents the capacity of said battery at different times, when said battery is being used to supply power to said device, wherein said set of cumulative data is acquired by monitoring the time duration value between each pair of adjacent decrement levels in a succession of decrement levels, and said decrement levels represent successive lower levels of the power capacity of said battery, as power is being drawing from said battery;
   selectively processing said set of cumulative data to provide an estimate of the battery time that is available at said specified time; and
   using said estimate to determine whether said battery has sufficient power capacity to complete a particular task subsequent to said specified time.

2. The method of claim 1, wherein:
   said time duration values are monitored using a monitoring mechanism in a battery controller associated with said battery.

3. The method of claim 1, wherein:
   a set of time duration values are acquired for each of said pairs of adjacent decrement levels, during a succession of uses of said battery to supply power, wherein one of the time duration values for the set of a given pair is acquired each time battery capacity decreases from one level of the given pair to the other level thereof.

4. The method of claim 3, wherein:
   a specified number of the most recently acquired time duration values in each of said sets of values is averaged, to provide a most recent average time duration value for each of said pairs of adjacent decrement levels.

5. The method of claim 1, wherein:
   said method includes recognizing that said battery is being operated in a particular one of a plurality of power use modes, and one of said sets of cumulative data is acquired for each power use mode.

6. The method of claim 5, wherein:
   said method includes recognizing that said battery is being operated in either a maximum, minimum, normal, or standby mode of power use, selectively.

7. The method of claim 1, wherein:
   estimates of the battery time that is available at said specified time are selectively made available for each of a plurality of power use modes.

8. The method of claim 1, wherein:
   when it is determined that said battery has insufficient power capacity to complete said particular task, a notice thereof is provided to a user of said electronic device.

9. The method of claim 1, wherein:
   a second set of cumulative data is acquired that represents the capacity of said battery at different times, when said battery is being recharged, and said second set of data is selectively processed to provide an estimate of the time required to recharge said battery up to a prespecified capacity from a second specified time.

10. The method of claim 1, wherein:
    said task is associated with predicting a period of time that an electronic device comprising a computer will be operated in standby mode by said battery, and said determining step comprises determining whether said battery has sufficient power capacity for said standby mode operation.

11. A computer program product stored in a computer readable storage medium for providing information relating to the power capacity of a rechargeable battery at a specified time, wherein the battery is disposed to supply power to an electronic device, the computer program product comprising:
   first instructions for acquiring a set of cumulative data that represents the capacity of said battery at different times, when said battery is being used to supply power to said device, wherein, said set of cumulative data is acquired by monitoring the time duration value between each pair of adjacent decrement levels in a succession of decrement levels, and said decrement levels represent successively lower levels of the power capacity of said battery, as power is being drawn from said battery;
   second instructions for selectively processing said set of cumulative data to provide an estimate of the battery time that is available at said specified time; and
   third instructions for using said estimate to determine whether said battery has sufficient power capacity to complete a particular task subsequent to said specified time.

12. The computer program product of claim 11, wherein:
a set of time duration values are acquired for each of said pairs of adjacent decrement levels during a succession of uses of said battery to supply power, wherein one time duration value for the set of a given pair is acquired each time battery capacity decreases from one level of the given pair to the other level thereof.

13. The computer program product of claim 12, wherein:
a specified number of the most recently acquired time duration values in each of said sets of values is averaged, to provide a most recent average time duration value for each of said pairs of adjacent decrement levels.

14. The computer program product of claim 11, wherein:
   estimates of the battery time that is available at said specified time are selectively made available for each of a plurality of power use modes.

15. An apparatus for providing information relating to the power capacity of a rechargeable battery at a specified time, wherein the battery is disposed to supply power to an electronic device, the apparatus comprising:
   a first component for acquiring a set of cumulative data that represents the capacity of said battery at different times, when said battery is being used to supply power to said device, wherein said set of cumulative data is acquired by monitoring the time duration value between each pair of adjacent decrement levels in a succession of decrement levels and said decrement levels represent successively lower levels of the power capacity of said battery, as power is being drawn from said battery;
   a second component for selectively processing said set of cumulative data to provide an estimate of the battery time that is available at said specified time; and
   a third component for using said estimate to determine whether said battery has sufficient power capacity to complete a particular task subsequent to said specified time.

16. The apparatus of claim 15, wherein:
said time duration values are monitored using a monitoring mechanism in a battery controller associated with said battery.

17. The apparatus of claim 15, wherein:
estimates of the battery time that is available at said specified time are selectively made available at each of a plurality of power use modes.

* * * * *